United States Patent
An (10) Patent No.: US 10,468,470 B2
(45) Date of Patent: Nov. 5, 2019

(54) OLED DISPLAY MODULE AND METHOD OF FORMING THE SAME

(71) Applicant: Wuhan China Star Optoelectronics Technology Co., Ltd., Wuhan, Hubei (CN)

(72) Inventor: Taisheng An, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 89 days.

(21) Appl. No.: 15/552,487

(22) PCT Filed: Apr. 20, 2017

(86) PCT No.: PCT/CN2017/081264
§ 371 (c)(1),
(2) Date: Aug. 21, 2017

(87) PCT Pub. No.: WO2018/152948
PCT Pub. Date: Aug. 30, 2018

(65) Prior Publication Data
US 2018/0247989 A1    Aug. 30, 2018

(30) Foreign Application Priority Data
Feb. 27, 2017 (CN) .......................... 2017 1 0109074

(51) Int. Cl.
*H01L 27/32* (2006.01)
(52) U.S. Cl.
CPC ...... *H01L 27/3255* (2013.01); *H01L 27/3276* (2013.01); *H01L 2227/323* (2013.01)

(58) Field of Classification Search
None
See application file for complete search history.

(56) References Cited

U.S. PATENT DOCUMENTS

| 9,831,208 B2 | 11/2017 | Cheng et al. | |
| 2003/0231263 A1 | 12/2003 | Kato et al. | |
| 2006/0001819 A1* | 1/2006 | Maeng ................ | G02F 1/1345 349/149 |
| 2011/0102410 A1 | 5/2011 | Cho et al. | |
| 2011/0193478 A1* | 8/2011 | Kim ...................... | H05K 1/189 315/32 |

(Continued)

FOREIGN PATENT DOCUMENTS

| CN | 101060734 A | 4/2007 |
| CN | 102254512 A | 11/2011 |

(Continued)

*Primary Examiner* — Sue A Purvis
*Assistant Examiner* — Jordan M Klein
(74) *Attorney, Agent, or Firm* — Andrew C. Cheng (57) ABSTRACT

An organic light-emitting diode (OLED) display module and a method of forming the OLED display module are proposed. The OLED display module includes an OLED display screen comprising a display signal input terminal and a driver chip. The driver chip is fixed on a back of the OLED display screen and includes a driving signal output terminal. A signal output by the driving signal output terminal is led out from two or more terminals of the driver chip and finally input to the display signal input terminal. The risk of the OLED display module is effectively reduced while the yield rate is improved.

16 Claims, 4 Drawing Sheets

(56) References Cited

U.S. PATENT DOCUMENTS

| | | | |
|---|---|---|---|
| 2012/0075268 A1* | 3/2012 | Chung | G02F 1/13452 345/204 |
| 2014/0118969 A1* | 5/2014 | Lee | H01L 23/4985 361/749 |
| 2014/0239317 A1* | 8/2014 | Bang | H05K 1/147 257/88 |
| 2016/0088726 A1* | 3/2016 | Jeon | G02F 1/13452 361/749 |

FOREIGN PATENT DOCUMENTS

| | | |
|---|---|---|
| CN | 103995373 A | 8/2014 |
| CN | 104656296 A | 5/2015 |
| CN | 105489162 A | 4/2016 |
| CN | 106373897 A | 2/2017 |

\* cited by examiner

OLED DISPLAY MODULE AND METHOD OF FORMING THE SAME

BACKGROUND

1. Field of the Disclosure

The present disclosure relates to the field of liquid crystal display, and more particularly, to an organic light-emitting diode (OLED) display module and a method of forming the OLED display module.

2. Description of Related Art

Electron devices are more widely applied with the development of the technology. In addition to a display screen, a conventional electrical device includes a driver chip and/or a flexible printed circuit (FPC).

Figure 1:
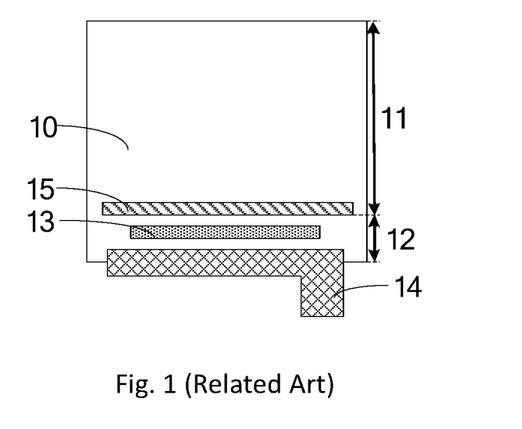
FIG. 1 is a schematic diagram of a front view of a conventional display module.
Figure 2:
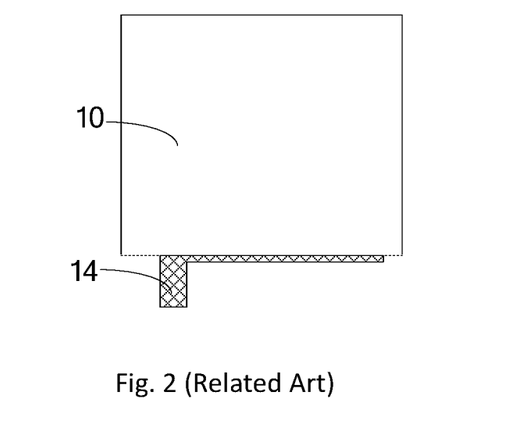
FIG. 2 is a schematic diagram of the back of the conventional display module.

FIG. 1 is a schematic diagram of a front view of a conventional display module. FIG. 2 is a schematic diagram of the back of the conventional display module. A large part of a lower border zone 12 remains on the lower area of the effective zone 11 because of the front of display screen 10. A driver chip 13 and an FPC 14 are arranged on the lower border zone 12 to supply a display signal input terminal 15 with a driving signal. The driver chip 13 bonds with an indium tin oxide (ITO) pad arranged on the display screen through an input pad and an output pad inside the driver chip 13.

Figure 3:
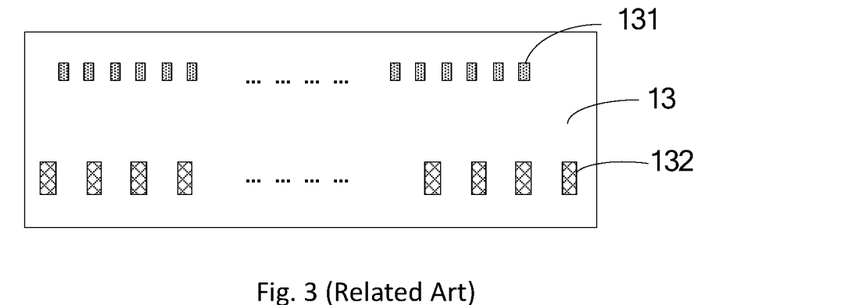
FIG. 3 shows a bonding surface of the driver chip and the display screen.

Please refer to FIG. 3. FIG. 3 shows a bonding surface of the driver chip 13 and the display screen 10. A signal output pin 131 of the driver chip 13 is arranged at a first terminal of the driver chip 13, and a signal input pin 132 of the driver chip 13 is arranged at a second terminal of the driver chip 13. The first and second terminals of the driver chip 13 are opposite terminals in a longitudinal direction.

Because of the improvement of the resolution of the display screen, the driver chip includes more and more input pads and output pads. The display screen includes more and more pads and source lines on the surface as well. Once the area of the lower border zone 12 becomes great enough with a high resolution, the pads on the display screen and the display screen are reduced obviously with denser source lines. It becomes much harder to design a display module due to the reduced pads and the denser source lines. It's also bad for the reducing yield rate of the display module.

OLED is characterized by self-illumination, low driver voltage, high illumination efficiency, short response time, high clarity and contrast, flexible display, large-area full-color display, etc. Besides, no light guide plates (LGPs) are arranged in an OLED display screen for separation compared with a liquid crystal display screen of related art.

In light of the above-mentioned characteristics of the OLED, it is necessary to design a more user-friendly OLED display module.

SUMMARY

An object of the present disclosure is to propose an OLED display module and a method of forming the display module to reduce the risk of designing the OLED display module and to enhance the yield rate.

According to one aspect of the present disclosure, an organic light-emitting diode (OLED) display module includes an OLED display screen comprising a display signal input terminal, a driver chip and a flexible printed circuit (FPC). The driver chip is fixed on a back of the OLED display screen includes a driving signal output terminal and a driving signal input terminal. A signal output by the driving signal output terminal is led out from two or more terminals of the driver chip through a first connection line and finally input to the display signal input terminal. The FPC is coupled to the driving signal input terminal through a second connection line. The first connection line and the second connection line are arranged on the back of the OLED display screen. The first connection line is connected between the display signal input terminal and the driving signal output terminal through a connection pad.

According to another aspect of the present disclosure, an organic light-emitting diode (OLED) display module includes an OLED display screen comprising a display signal input terminal and a driver chip. The driver chip is fixed on a back of the OLED display screen and includes a driving signal output terminal. A signal output by the driving signal output terminal is led out from two or more terminals of the driver chip and finally input to the display signal input terminal.

According to still another aspect of the present disclosure, a method of forming an organic light-emitting diode (OLED) display module includes providing an OLED display screen where a display signal input terminal is arranged, providing a driver chip fixed on a back of the OLED display screen and comprising a driving signal output terminal, and leading out a signal output by the driving signal output terminal from two or more terminals of the driver chip and finally inputting the signal to the display signal input terminal.

The present disclosure brings advantages as follows. Routings on the OLED display screen are well distributed and the size of the pad is ensured. Besides, the risk of the OLED display module is effectively reduced while the yield rate is improved. It is because the driver chip is arranged on the back of the OLED display screen and a signal output by a driving signal output terminal is led out by two or more terminals of the driver chip.

DETAILED DESCRIPTION OF THE EMBODIMENTS

The drawings illustrate embodiments of the invention and, together with the description, serve to explain the principles of the invention.

Figure 4:
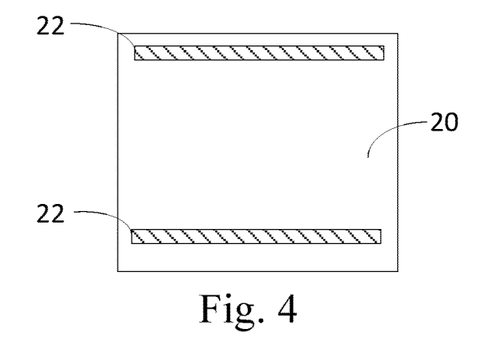
FIG. 4 illustrates a front view of an organic light-emitting diode (OLED) display module according to a first embodiment of the present disclosure.
Figure 5:
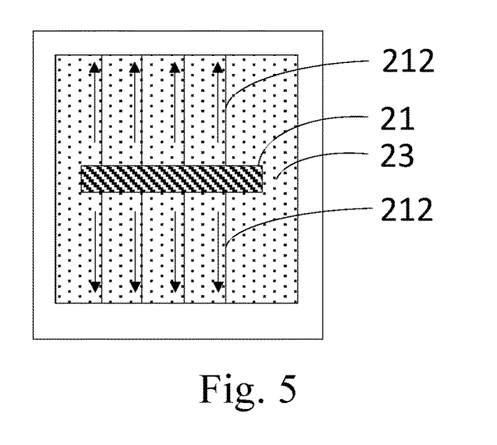
FIG. 5 illustrates a back view of the organic light-emitting diode (OLED) display module shown in FIG. 4.

Please refer to FIG. 4 and FIG. 5 illustrating an organic light-emitting diode (OLED) display module according to a first embodiment of the present disclosure. The OLED display module includes an OLED display screen 20 and a driver chip 21.

The OLED display screen 20 is characterized by self-illumination, low driver voltage, etc. A display signal is input to the OLED display screen 20 through a display signal input terminal 22 arranged on the front side of the OLED display screen 20 so that the OLED display screen 20 can show images normally.

The two display signal input terminals 22 are arranged on two opposite terminals of the OLED display screen 20 correspondingly in this embodiment. In another embodiment, display signal input terminals 22 are arranged on two adjacent terminals of the OLED display screen 20 correspondingly. Further, display signal input terminals 22 are arranged on other three or four terminals.

The driver chip 21 is fixed on the back of the OLED display screen 20. Specifically, the driver chip 21 is immobilized on a conductive coating layer 23. In at least one embodiment, the driver chip 21 is fastened on the center of the back of the OLED display screen 20.

Figure 6:
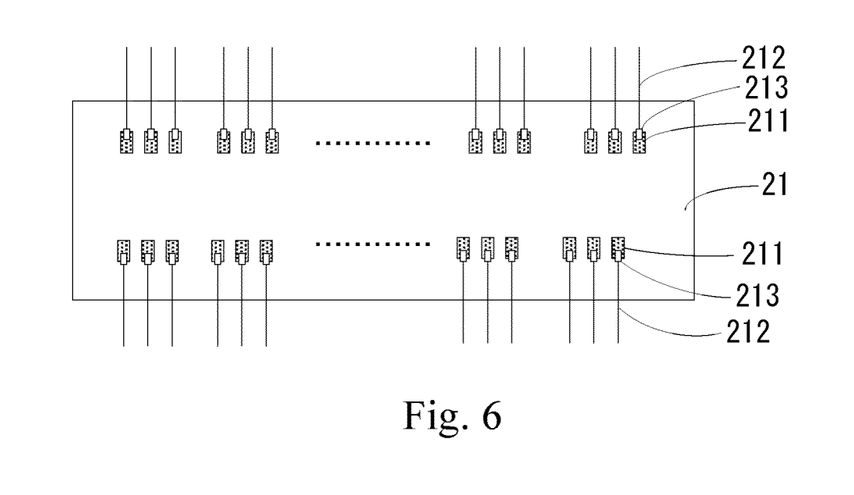
FIG. 6 illustrates a bonding surface of the driver chip and the display screen shown in FIG. 4.

Please refer to FIG. 6 illustrating the driver chip 21. The driver chip 21 includes a driving signal output terminal 211. A signal output by the driving signal output terminal 211 is led out from two terminals of the driver chip 21 and finally input to the display signal input terminal 22.

The two terminals of the driver chip 21 are two opposite terminals of the driver chip 21 in a longitudinal direction in this embodiment. In another embodiment, two terminals of the driver chip 21 are adjacent terminals of the driver chip 21 in a longitudinal direction. In another embodiment, a signal output by the driving signal output terminal 211 is led out from three or four terminals of the driver chip 21, which is not limited by the present disclosure actually.

In this embodiment, a signal output by the driving signal output terminal 211 is led out from the two terminals of the driver chip 21 through a first connection line 212 and finally input to the display signal input terminal 22. The first connection line 212 is arranged on the back of the OLED display screen 20. A connection pad 213 is arranged on one terminal of the first connection line 212. This terminal is connected to the driving signal output terminal 211 correspondingly. The other terminal of the first connection line 212 is connected to the display signal input terminal 22.

One part of the first connection line 212 extends to the driving signal output terminal 211 of the driver chip 21 from one terminal of the OLED display screen 20 including the display signal input terminal 22 in this embodiment. Besides, the other part of the first connection line 212 extends to the other terminal of the driver chip 21 from the other terminal of the OLED display screen 20 including the display signal input terminal 22. More specifically, as FIG. 5 illustrates, a number of solid lines with an arrow indicate signal paths between the driver chip 21 and the display signal input terminal 22. The number of solid lines with an arrow 212 are signal paths related to one part of the first connection line 212.

The first connection line 212 is formed in the conductive coating layer 23 in this embodiment.

The driver chip is arranged on the back of the OLED display screen 30, and a signal output by the driving signal output terminal are led out from two or more terminals of the driver chip in the above-mentioned embodiment. In this way, wires on the OLED display screen 30 are well distributed, and the size of the pad is ensured. Besides, the risk of designing the OLED display module is effectively reduced and the yield rate is obviously improved.

Figure 7:
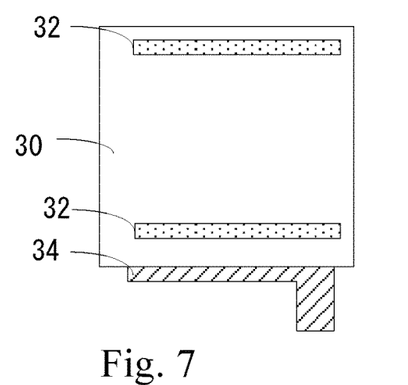
FIG. 7 illustrates a front view of an organic light-emitting diode (OLED) display module according to a second embodiment of the present disclosure.
Figure 8:
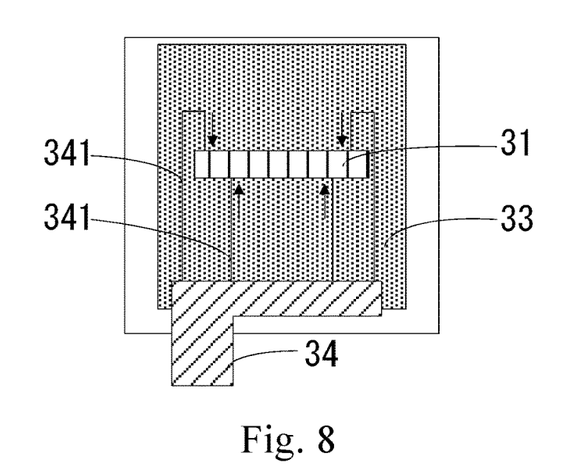
FIG. 8 illustrates a back view of the organic light-emitting diode (OLED) display module shown in FIG. 7.

Please refer to FIG. 7 and FIG. 8 illustrating an organic light-emitting diode (OLED) display module according to another embodiment of the present disclosure. The OLED display module includes an OLED display screen 30, a driver chip 31, and a flexible printed circuit (FPC) 34.

The OLED display screen 30 introduced by the present embodiment is identical or similar to the corresponding structure described by the above-mentioned embodiments so the aforesaid descriptions can be certainly referred to. The present disclosure will not go further on this topic.

Figure 9:
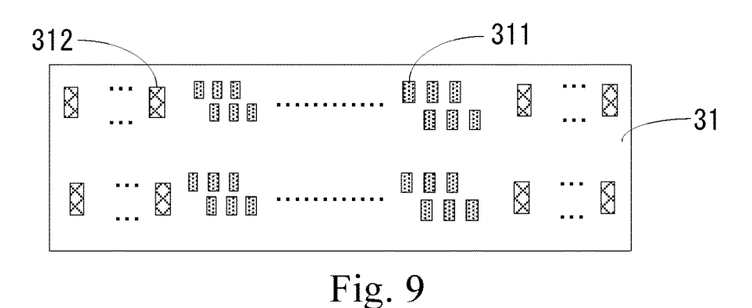
FIG. 9 illustrates a bonding surface of the driver chip and the display screen shown in FIG. 7.

The FPC 34 inputs a driving signal to the driver chip 31 in this embodiment. As FIG. 9 illustrates, the driver chip 31 includes driving signal output terminals 312 as well as driving signal output terminals 311.

The driving signal output terminals 312 are distributed at two sides of the bottom of the driver chip 31. The driving signal output terminals 311 are distributed between the driving signal input terminals 312 arranged at two sides of the bottom of the driver chip 31. Definitely, the driving signal input terminals 312 may be arranged on one terminal of the driver chip 31.

To increase an effective display area on the OLED display module, the FPC 34 is fixed on the back of the OLED display screen 30 and electrically connected to the driving signal input terminal 312 of the driver chip 31 through a second connection line 341. As FIG. 8 illustrates, a number of solid lines with an arrow indicates driving signal paths of the second connection line 341 between the FPC 34 and the driving signal input terminal 312.

The second connection line 341 is formed in a conductive coating layer 33 in the second embodiment. In another embodiment, a flexible printed circuit (FPC) 34 may be fixed on the front of an organic light-emitting diode (OLED) display screen 30.

Figure 10:
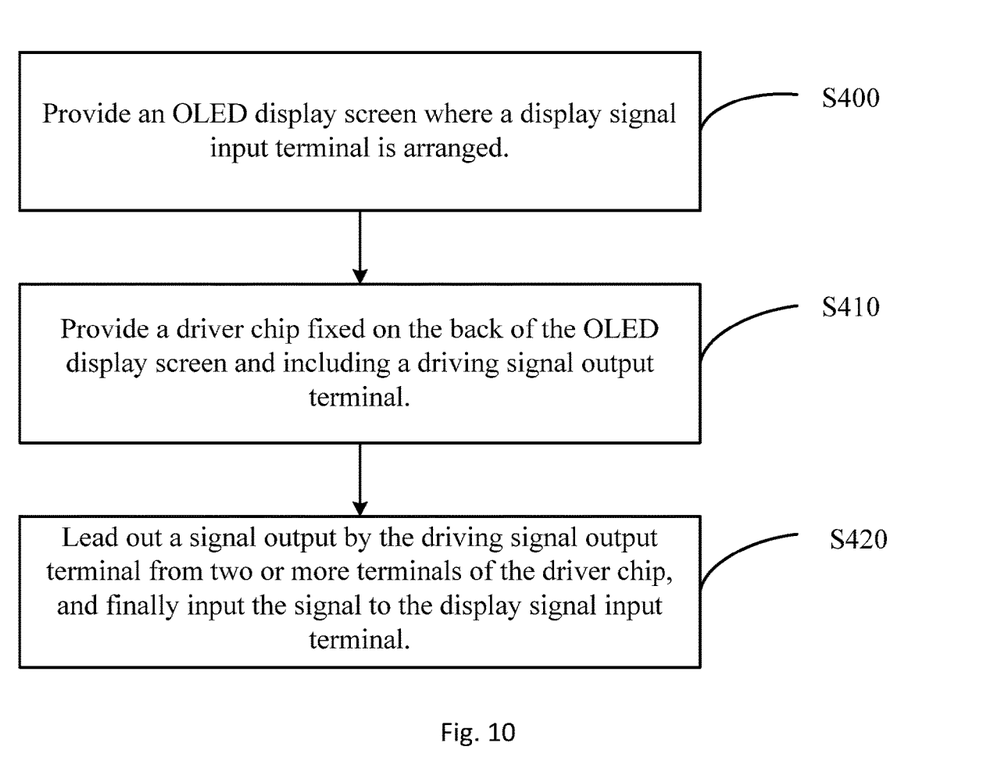
FIG. 10 illustrates a method of forming an organic light-emitting diode (OLED) display module according to a third embodiment of the present disclosure.

Please refer to FIG. 10 illustrating a method of forming an organic light-emitting diode (OLED) display module according to a third embodiment of the present disclosure. The method includes steps as follows.

Step S400: Provide an OLED display screen 30 where a display signal input terminal 32 is arranged.

The display signal input terminals 32 are settled at two opposite terminals of the OLED display screen 30 correspondingly in this embodiment. Display signal input terminals 32 may be settled at two adjacent terminals of an organic light-emitting diode (OLED) display screen 30 in another embodiment. Further, display signal input terminals 32 are arranged on three or even four terminals of an organic light-emitting diode (OLED) display screen 30.

Step S410: Provide a driver chip 31 fixed on the back of the OLED display screen 30 and including a driving signal output terminal 311.

Specifically, the driver chip 31 is fastened on a conductive coating layer 33 arranged on the back of the OLED display screen 30. In at least one embodiment, the driver chip 31 is fixed on the center of the back of the OLED display screen 30.

Step S420: Lead out a signal output by the driving signal output terminal 311 from two or more terminals of the driver chip 31, and finally input the signal to the display signal input terminal 32.

A signal output by the driving signal output terminal 311 is led out from the two terminals of the driver chip 31 through a first connection line 212 and finally input to the display signal input terminal 32. The two terminals of the driver chip 31 are two opposite terminals of the driver chip 31 in a longitudinal direction in this embodiment. In another embodiment, a signal output by a driving signal output terminal 311 is led out from two adjacent terminals of an organic light-emitting diode (OLED) display screen 30. Further, a signal output by a driving signal output terminal 311 is led out from three or even four terminals of an organic light-emitting diode (OLED) display screen 30.

A first connection line is arranged on the back of the OLED display screen 30. A connection pad 213 is arranged on one terminal of the first connection line 212. This terminal is connected to the driving signal output terminal 311 correspondingly. The other terminal of the first connection line 212 is connected to the display signal input terminal 32.

Specifically, one part of the first connection line 212 extends to the driving signal output terminal 311 of the driver chip 31 from one terminal of the OLED display screen 30 including the display signal input terminal 32 in this embodiment. Besides, the other part of the first connection line 212 extends to the other terminal of the driver chip 31 including the driving signal output terminal 311 from the other terminal of the OLED display screen 30.

In at least one embodiment, the first connection line 212 formed in a conductive coating layer 33.

Figure 11:
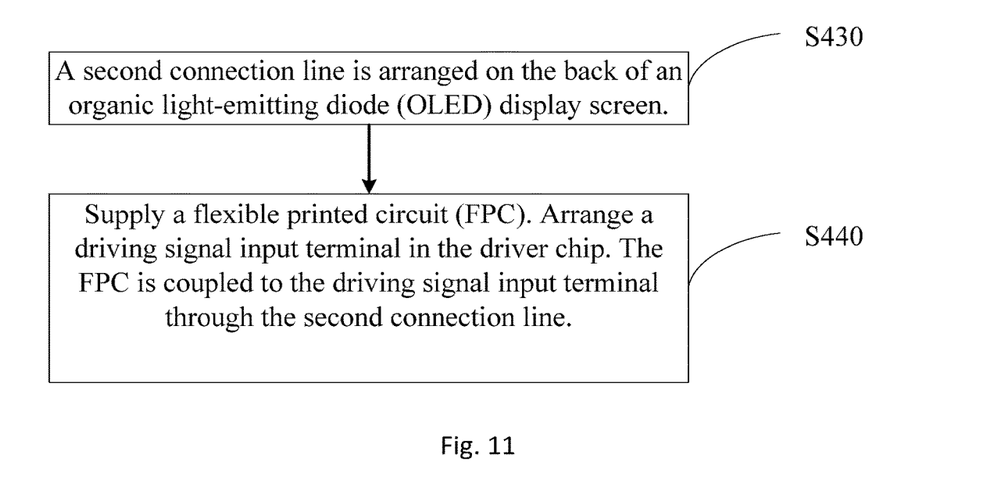
FIG. 11 illustrates a method of forming an organic light-emitting diode (OLED) display module according to a fourth embodiment of the present disclosure.

Please refer to FIG. 11. A method further includes following steps in another embodiment.

Step S430: A second connection line 341 is arranged on the back of an organic light-emitting diode (OLED) display screen.

The second connection line 341 is arranged on the back of the OLED display screen 30. Specifically, the second connection line 341 is placed in the conductive coating layer 33 on the back of the OLED display screen 30.

Step S440: Supply a flexible printed circuit (FPC) 34. Arrange a driving signal input terminal 312 in the driver chip 31. The FPC 34 is coupled to the driving signal input terminal 312 through the second connection line 341.

In addition to a driving signal output terminals 311, the driver chip 31 further includes the driving signal input terminals 312. Specifically, the driving signal input terminals 312 are distributed at two sides of the bottom of the driver chip 31. The driving signal output terminals 311 are distributed between the driving signal input terminals 312 arranged at the two sides of the bottom of the driver chip 31.

The FPC 34 is electrically connected to the driving signal input terminal 312 through the second connection line 341 to input a driving signal to the driver chip 31. The FPC 34 is fastened on the back of the OLED display screen 30 to increase an effective display area on the OLED display module. In another embodiment, the FPC 34 may be fixed on the front of the OLED display screen 30.

With respect to the OLED display module produced in all of the embodiments with the above-mentioned method, please refer to the aforesaid descriptions. The present disclosure will not go further on this topic.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. An organic light-emitting diode (OLED) display module, comprising:
   an OLED display screen, comprising:
      a first display signal input terminal arranged on one side of the OLED display screen; and
      a second display signal input terminal arranged on another side opposite the one side in plan view of the OLED display screen;
   a driver chip, fixed on a back of the OLED display screen and comprising:
      a first driving signal output terminal arranged on the one side of the driver chip;
      a second driving signal output terminal arranged on the another side of the driver chip;
      a first driving signal input terminal arranged on the one side of the driver chip; and
      a second driving signal input terminal arranged on the another side of the driver chip;
   a first connection line arranged on the back of the OLED display screen;
   a second connection line arranged on the back of the OLED display screen;
   a third connection line arranged on the back of the OLED display screen;
   a fourth connection line arranged on the back of the OLED display screen;
   a flexible printed circuit (FPC), coupled to the first driving signal input terminal on the one side of the driver chip through the third connection line, and coupled to the second driving signal input terminal on the another side of the driver chip through the four connection line;
   wherein a first connection pad is arranged on one end of the first connection line, and a second connection pad is arranged on one end of the second connection line;
   wherein the end where the first connection pad is arranged on, of the first connection line is connected to the first driving signal output terminal though the first connection pad, and the other end of the first connection line is connected to the first display signal input terminal on the one side of the OLED display screen; and the end where the second connection pad is arranged on, of the second connection line is connected to the second driving signal output terminal though the second connection pad, and the other end of the second connection line is connected to the second display signal input terminal on the another side of the OLED display screen, so that the first connection line and the second connection line extend to different sides of the OLED display screen from the driver chip in different directions;
   wherein a signal output by the first driving signal output terminals is led out from the driver chip through the first connection line, and the signal is finally input to the first display signal input terminal on the one side of the OLED display screen; and a signal output by the second driving signal output terminals is led out from the driver chip through the second connection line, and the signal is finally input to the second display signal input terminal on the another side of the OLED display screen.

2. The OLED display module of claim 1, wherein the OLED display screen comprises a first side and a second side opposite to each other, and the driver chip comprises a third side and a fourth side opposite to each other;
the first side corresponds to the third side, and the second side corresponds to the fourth side;
the first display signal input terminal is arranged on the first side, and the second display signal input terminal is arranged on the second side; the first driving signal output terminal is arranged on the third side, and the second driving signal output terminal is arranged on the fourth side;
the end where the first connection pad is arranged on, of the first connection line is connected to the first driving signal output terminal on the third side though the first connection pad, and the other end of the first connection line is connected to the first display signal input terminal on the first side; and
the end where the second connection pad is arranged on, of the second connection line is connected to the second driving signal output terminal on the fourth side though the second connection pad, and the other end of the second connection line is connected to the second display signal input terminal on the second side;
a first direction is the first connection line extending to the first side of the OLED display screen from the third side of the driver chip, and a second direction is the second connection line extending to the second side of the OLED display screen from the fourth side of the driver chip;
the first direction and the second direction are opposite to each other.

3. The OLED display module of claim 1, wherein the first connection line, the second connection line, the third connection line, and the fourth connection line are formed in a conductive coating layer.

4. The OLED display module of claim 1, wherein the driver chip comprises a third side and a fourth side opposite to each other;
the first driving signal output terminal is arranged on the third side, and the second driving signal output terminal is arranged on the fourth side;
the first driving signal input terminal is arranged on the third side, and the second driving signal input terminal is arranged on the fourth side;
a first distance is located between a center of the third side and the first driving signal output terminal, and a second distance is located between the center of the third side and the first driving signal input terminal;
a third distance is located between a center of the fourth side and the second driving signal output terminal, and a fourth distance is located between the center of the fourth side and the second driving signal input terminal;
the first distance is less than the second distance, and the third distance is less than the fourth distance.

5. An organic light-emitting diode (OLED) display module, comprising:
an OLED display screen 100, comprising:
a first side;
a second side opposite to the first side in plan view; and
a plurality of display signal input terminals arranged and distributed on the first side and the second side;
a driver chip, fixed on a back of the OLED display screen and comprising:
a third side corresponding to the first side;
a fourth side corresponding to the second side; and
a plurality of driving signal output terminals arranged and distributed on the third side and the fourth side;
wherein a signal output by one of the plurality of driving signal output terminals on the third side is led out from the driver chip, and the signal is finally input to one of the plurality of display signal input terminals on the first side corresponding to the third side; and a signal output by one of the plurality of driving signal output terminals on the fourth side is led out from the driver chip, and the signal is finally input to one of the plurality of display signal input terminals on the second side corresponding to the fourth side.

6. The OLED display module of claim 5, further comprising:
a plurality of first connection lines arranged on the back of the OLED display screen;
wherein a connection pad is arranged on one end of each of the plurality of first connection lines;
wherein the end where the connection pad is arranged on, of each of the plurality of first connection lines is connected to one of the plurality of driving signal output terminals on the third side though the connection pad, and the other end of the plurality of first connection lines is connected to one of the plurality of display signal input terminals on the first side corresponding to the third side; and the end where the connection pad is arranged on, of each of the plurality of first connection lines is connected to one of the plurality of driving signal output terminals on the fourth side though the connection pad, and the other end of the plurality of first connection lines is connected to one of the plurality of display signal input terminals on the second side corresponding to the fourth side;
wherein a signal output by one of the plurality of driving signal output terminals on the third side is led out from the driver chip through one of the plurality of first connection lines, and the signal is finally input to one of the plurality of display signal input terminals on the first side corresponding to the third side; and a signal output by one of the plurality of driving signal output terminals on the fourth side is led out from the driver chip through one of the plurality of first connection lines, and the signal is finally input to one of the plurality of display signal input terminals on the second side corresponding to the fourth side.

7. The OLED display module of claim 6, wherein the first side and the second side are located opposite to each other, and the third side and the fourth side are located opposite to each other;
a first direction is one of the plurality of first connection lines extending to the first side of the OLED display screen from the third side of the driver chip, and a second direction is one of the plurality of first connection lines extending to the second side of the OLED display screen from the fourth side of the driver chip;
the first direction and the second direction are opposite to each other.

8. The OLED display module of claim 6, wherein each of the plurality of first connection lines is formed in a conductive coating layer.

9. The OLED display module of claim 5, further comprising:

a plurality of second connection lines, arranged on the back of the OLED display screen;

a flexible printed circuit (FPC);

a plurality of driving signal input terminals, arranged on the driver chip, wherein the FPC is electrically connected to the plurality of driving signal input terminals of the driver chip through the plurality of second connection lines, and each of the plurality of driving signal input terminals is connected to corresponding one of the plurality of second connection lines.

10. The OLED display module of claim 9, wherein the plurality of driving signal output terminals are arranged on the third side and the fourth side;

the plurality of driving signal input terminals are arranged on the third side and the fourth side;

a first distance is located between a center of the third side and anyone of the plurality of driving signal output terminals, and a second distance is located between the center of the third side and anyone of the plurality of driving signal input terminals;

a third distance is located between a center of the fourth side and anyone of the plurality of driving signal output terminals, and a fourth distance is located between the center of the fourth side and anyone of the plurality of driving signal input terminals;

the first distance is less than the second distance, and the third distance is less than the fourth distance.

11. A method of forming an organic light-emitting diode (OLED) display module, comprising:

providing an OLED display screen, wherein a first side, a second side opposite the first side in plan view, and a plurality of display signal input terminals are arranged and distributed on the first side and the second side;

providing a driver chip fixed on a back of the OLED display screen and comprising a third side corresponding to the first side, a fourth side corresponding to the second side, and a plurality of driving signal output terminals arranged and distributed on the third side and the fourth side;

leading out a signal output by one of the plurality of driving signal output terminals on the third side from the driver chip and finally inputting the signal to one of the plurality of display signal input terminals on the first side corresponding to the third side; and leading out a signal output by one of the plurality of driving signal output terminals on the fourth side from the driver chip and finally inputting the signal to one of the plurality of display signal input terminals on the second side corresponding to the fourth side.

12. The method of claim 11, further comprising:

providing a plurality of first connection lines arranged on the back of the OLED display screen;

wherein a connection pad is arranged on one end of each of the plurality of first connection lines;

wherein the end where the connection pad is arranged on, of each of the plurality of first connection lines is connected to one of the plurality of driving signal output terminals on the third side though the connection pad, and the other end of the plurality of first connection lines is connected to one of the plurality of display signal input terminals on the first side corresponding to the third side; and the end where the connection pad is arranged on, of each of the plurality of first connection lines is connected to one of the plurality of driving signal output terminals on the fourth side though the connection pad, and the other end of the plurality of first connection lines is connected to one of the plurality of display signal input terminals on the second side corresponding to the fourth side;

wherein a signal output by one of the plurality of driving signal output terminals on the third side is led out from the driver chip through one of the plurality of first connection lines, and the signal is finally input to one of the plurality of display signal input terminals on the first side corresponding to the third side; and a signal output by one of the plurality of driving signal output terminals on the fourth side is led out from the driver chip through one of the plurality of first connection lines, and the signal is finally input to one of the plurality of display signal input terminals on the second side corresponding to the fourth side.

13. The method of claim 12, wherein the first side and the second side are located opposite to each other, and the third side and the fourth side are located opposite to each other;

a first direction is one of the plurality of first connection lines extending to the first side of the OLED display screen from the third side of the driver chip, and a second direction is one of the plurality of first connection lines extending to the second side of the OLED display screen from the fourth side of the driver chip;

the first direction and the second direction are opposite to each other.

14. The method of claim 12, further comprising:

forming each of the plurality of first connection lines in a conductive coating layer.

15. The method of claim 11, further comprising:

arranging a plurality of second connection lines on the back of the OLED display screen;

supplying a flexible printed circuit (FPC); arranging a plurality of driving signal input terminals on the driver chip, and electrically connecting the FPC to the plurality of driving signal input terminals through the plurality of second connection lines, wherein each of the plurality of driving signal input terminals is connected to corresponding one of the plurality of second connection lines.

16. The method of claim 15, wherein the plurality of driving signal output terminals are arranged on the third side and the fourth side;

the plurality of driving signal input terminals are arranged on the third side and the fourth side;

a first distance is located between a center of the third side and anyone of the plurality of driving signal output terminals, and a second distance is located between the center of the third side and anyone of the plurality of driving signal input terminals;

a third distance is located between a center of the fourth side and anyone of the plurality of driving signal output terminals, and a fourth distance is located between the center of the fourth side and anyone of the plurality of driving signal input terminals;

the first distance is less than the second distance, and the third distance is less than the fourth distance.

* * * * *